United States Patent [19]

Molnar

[11] Patent Number: 6,111,436

[45] Date of Patent: *Aug. 29, 2000

[54] MEASUREMENT OF SIGNAL PROPAGATION DELAY USING ARBITERS

[75] Inventor: Charles E. Molnar, deceased, late of Sunnyvale, Calif., by Donna A. Molnar, executrix

[73] Assignee: Sun Microsystems, Inc., Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/841,651

[22] Filed: Apr. 30, 1997

[51] Int. Cl.⁷ ........................................... H03K 5/19
[52] U.S. Cl. ................................. 327/19; 327/23; 327/24; 327/269
[58] Field of Search .................................. 327/18, 19, 23, 327/24, 262, 269, 270, 271; 331/11

[56] References Cited

U.S. PATENT DOCUMENTS

| | | | |
|---|---|---|---|
| 4,084,111 | 4/1978 | Matsuda | 307/264 |
| 4,218,658 | 8/1980 | Moeller | 328/109 |
| 4,433,919 | 2/1984 | Hoppe | 368/120 |
| 4,591,744 | 5/1986 | Koike | 307/518 |
| 4,757,217 | 7/1988 | Sawada et al. | 307/480 |
| 4,998,744 | 3/1991 | Cates | 307/518 |
| 5,323,065 | 6/1994 | Ebihara et al. | 307/272.2 |
| 5,420,531 | 5/1995 | Wetlaufer | 327/270 |
| 5,570,294 | 10/1996 | McMinn et al. | 364/481 |

*Primary Examiner*—Timothy P. Callahan
*Assistant Examiner*—An T. Luu
*Attorney, Agent, or Firm*—Finnegan, Henderson, Farabow, Garrett & Dunner, LLP

[57] ABSTRACT

Arbiter circuits placed between two signal path segments on a semiconductor chip to measure the difference in propagation delay between those paths at their beginning and end. Each arbiter circuit has two inputs, and outputs signals indicating which of its inputs is the first to receive a leading edge of an input transition. External circuitry monitors the arbiter outputs, and accordingly controls the application of the input transitions. By varying the delay of the input signal paths, the relative propagation delay can be determined.

13 Claims, 9 Drawing Sheets

NAND ARBITER

NOR ARBITER

MEASUREMENT OF SIGNAL PROPAGATION DELAY USING ARBITERS

BACKGROUND OF THE INVENTION

The present invention relates to the field of measuring propagation delay, and more particularly, to measuring such delays with circuitry embedded in semiconductor chips.

All electrical signals transmitted through a conduction path experience a propagation delay. Propagation delays generally result from properties of the conduction path such as load capacitance and signal line length.

Propagation delays affect systems differently depending upon the nature of those systems, but most systems can be affected adversely by relative propagation delay, which is the difference in propagation speeds between two paths. For example, in synchronous (clocked) circuits, differences in propagation delays between clock signals on different lines leads to clock skew, which degrades the performance of the circuit. Likewise, in high-performance, asynchronous (non-clocked) pipelines, knowing the relative propagation delay between the control and data signals is an important step in ensuring that the signals arrive in their correct order at a pipeline stage.

Therefore, accurate measurement of propagation delay on a semiconductor chip is desirable when designing and testing fabricated semiconductor chips. Conventional technologies for measuring propagation delay time typically involve on-chip probing techniques. Usually, these techniques involve physically inserting a probe at points on the chip that are to be tested.

Today's high-speed semiconductor circuits may experience delay times in the sub-nanosecond or picosecond range. The shortness of these delay times makes accurate measurements exceedingly difficult, even with the most advanced on-chip probing techniques. There is a need, therefore, to accurately and reliably measure absolute and relative signal path propagation delay times on a semiconductor chip.

SUMMARY OF THE INVENTION

Systems and methods consistent with the present invention determine propagation delays between signal paths on a semiconductor chip using arbiter circuits within the semiconductor chip at the ends of the to-be-measured signal paths. The arbiter circuits accurately determine which of two transitions transmitted on the signal paths arrive at the arbiters first.

The advantages and purpose of the invention will be set forth in part in the description which follows, and in part will be obvious from the description, or may be learned by practice of the invention. The advantages and purpose of the invention will be realized and attained by means of the elements and combinations particularly pointed out in the appended claims.

To attain the advantages and in accordance with the purpose of the invention, as embodied and broadly described herein, a circuit implemented on an integrated circuit is described. The circuit is used in determining propagation delay between first and second signal paths on the integrated circuit, and comprises a first and second arbiter circuit. The first arbiter circuit is coupled at its inputs to one end of the first and second signal paths, and includes mechanisms configured to determine on which of the first and second signal paths test transitions arrive first. Similarly, the second arbiter circuit is coupled at its inputs to a second end of the first and second signal paths, and includes mechanisms configured to determine on which of the first and second signal paths the test transitions arrive first.

Both the foregoing general description and the following detailed description are exemplary and explanatory only and do not restrict the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings.

DESCRIPTION OF THE PREFERRED EMBODIMENT

Reference will now be made in detail to the present preferred embodiments of the invention, examples of which are illustrated in the accompanying drawings. Wherever possible, the same reference numbers will be used throughout the drawings to refer to the same or like parts.

Systems and methods consistent with this invention use arbiter circuits to permit precise on-chip timing measurements by determining the relative arrival times between signal transitions in two signal path segments. External circuitry can adjust the timing of the transitions on the two paths to change the relative arrival time between the two transitions so propagation delay can be measured.

Arbiter circuits used in this invention precisely determine which of two signals arrive at the arbiter first, even if the time difference between the arrival of the signals is very small (e.g., on the order of picoseconds). Moreover, the arbiter stores its indication of which signal arrived first, so the indication may be transmitted to other circuitry at leisure.

In addition, the preferred embodiments of the arbiter circuits are simple and very small. Therefore, a semiconductor chip designer can place many arbiter circuits on a chip without occupying much chip area.

Systems and methods consistent with this invention include two arbiter circuits on each pair of paths for which relative propagation delay is to be measured. One of the arbiter circuits is connected at the beginning of both signal path segments and the other connected at the end of the path segments. An external test circuit sends a test signal transition down each of the paths. The arbiter at the beginning of the segment of the path to be tested observes and records which signal transition arrives first. The delay between the transitions at the beginning of the two path segments is adjusted externally until the transition arrival order at the arbiter at the beginning of the path segments reverses. When this reversal occurs, the test signal transitions arrive at the beginning of the two signal path segments at approximately the same time, indicating that the test signal transitions are as synchronized as possible at the first arbiter.

The above procedure is repeated for the arbiter located at the end of the path segments. The different in propagation delays between the two path segments is the amount of external delay that has to be added to the faster signal path until both signals arrive at the arbiter at the end of the two signal paths at approximately the same time. If one of the path segments is effectively of zero length, the described procedure measures the absolute delay in the other path segment.

Figure 1:
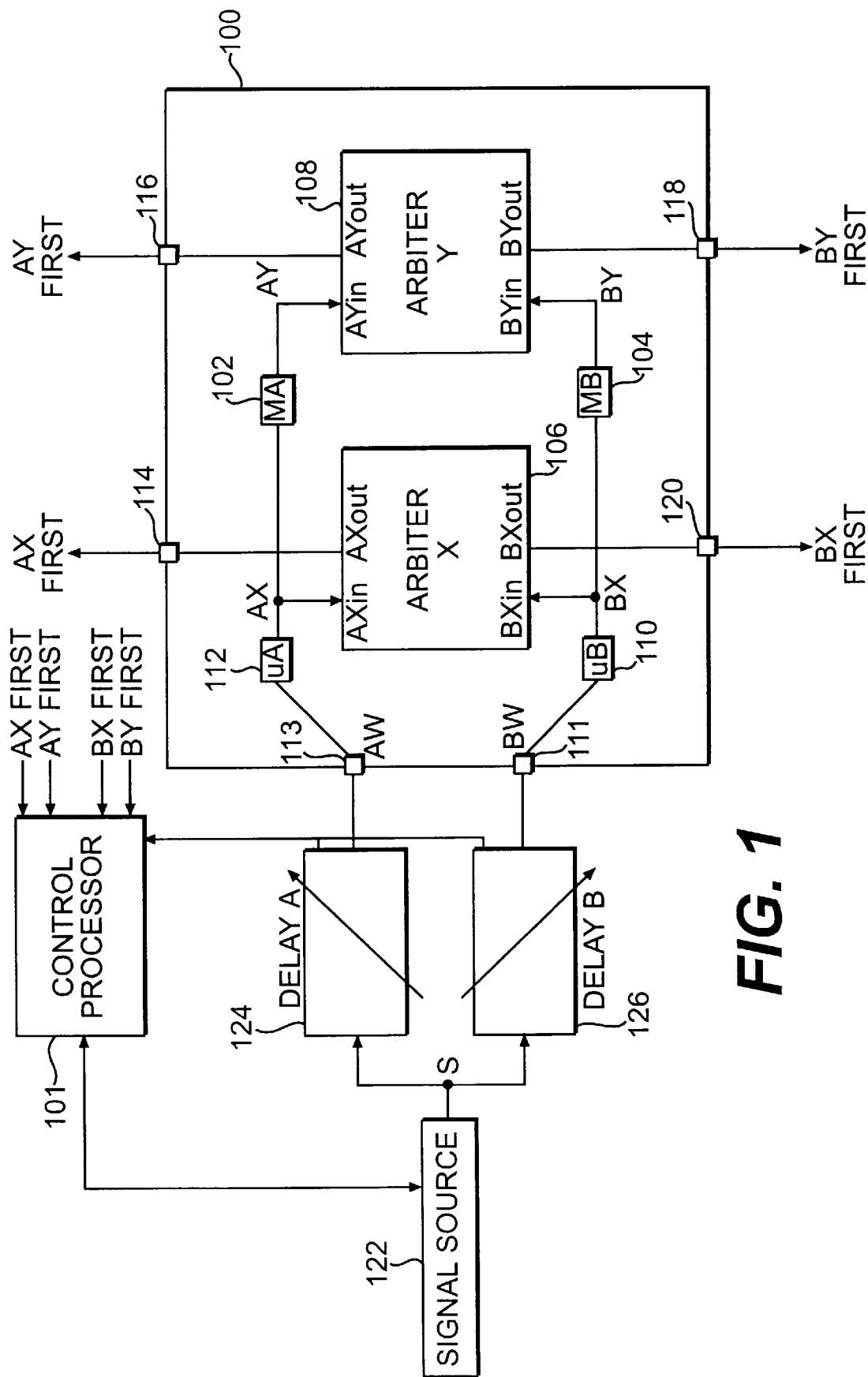
FIG. 1 is a block diagram showing the preferred embodiment of the present invention.

FIG. 1 shows a diagram a semiconductor chip 100 containing arbiter circuits 106, labeled as arbiter X, and 108, labeled as arbiter Y. Further, the system includes signal source 122 coupled to delay circuits 124 and 126. Optional control processor 101 is coupled to the signal source, the delay circuits and to several outputs from the semiconductor chip. The two path segment propagation delays to be measured are represented by elements 102 ("MA") and 104 ("MB"). Delays 102 and 104 may be caused by simple conductive paths, or by additional passive or active circuit elements. For simplicity of this discussion, the signal paths connecting delay 102 to arbiters 106 and 108 are assumed to introduce zero propagation delay into the system. Although in reality, the propagation delay associated with these paths would be non-zero, they may be included in the definition of delay 102. Likewise, the signals path connecting delay 104 to arbiters 106 and 108 are assumed to introduce zero propagation delay into the system, although they actually introduce a small delay. In a carefully designed chip, these non-zero delays would be arranged to be as identical as possible on the inputs of each arbiter.

The inputs to arbiters 106 and 108 in chip 100 are connected at opposite ends of the signal path delays 102 and 104 to form the two path segments to be measured. The outputs of arbiters 106 and 108 are transmitted off of chip 100 through pins 114, 116, 118, and 120.

Pins 111 and 113 receive the test signals being transmitted to the delay path segments 102 and 104 and the arbiters 106 and 108. Signals being transmitted to arbiters 106 and 108 experience various propagation delays on their way to the beginning of delay path segments 102 and 104. These delays, which may be unknown, are represented by elements 112 ("uA") and 110 ("uB").

Signal source 122 generates test transitions that are input to adjustable delay circuits 124 and 126. Delay circuits 124 and 126 independently introduce precise, operator-adjustable delays, into the signals sent to chip 100. These delay circuits may use, for example, a coaxial cable delay line of adjustable length. Because the delay of a signal transmitted through a measured length of coaxial cable can be precisely calculated, delay circuits 124 and 126 are capable of providing extremely precise delay adjustments (e.g., in the order of picoseconds).

Control processor 101 is coupled to and controls delay circuits 124, 126, and signal source 122. Processor 101 also receives the outputs from arbiter circuits 106, 108. With those connections, control processor 101 automates the method performed by the present invention. A human operator could also perform the functions of control processor 101.

As shown in FIG. 1, arbiter 106 contains two inputs, AXin and BXin, which are connected to the beginning of the two delay path segments 102 and 104, respectively. Arbiter 106 has two outputs, AXout and BXout. Then, arbiter 106 observes and records which signal transition at the beginning of delay path segments 102 and 104 arrives first at inputs AXin and BXin. If the first signal transition to arrive is at AXin, arbiter 106 generates a signal on AXout; if the first signal transition to arrive is at BXin, arbiter 106 generates a signal on BXout.

Arbiter 108 operates in a manner similar to arbiter 106. Arbiter 108 detects which of the two signal transitions at the end of delay path segments 102 and 104 arrives first at inputs AYin and BYin. If the signal at AYin arrives first, arbiter 108 generates a signal on AYout. If the signal at BYin arrives first, arbiter 108 generates a signal on BYout.

In operation, signal source 122 generates a single signal transition, which is sent to both adjustable delays 124 and 126. For a particular pair of delay settings of delay circuits 124 and 126, arbiter 106 reports via pin 114, AX First, or via pin 120, BX First, whether the transition at the beginning of delay path segment 102 or the transition at the beginning of delay path segment 104 is observed to arrive first. The arbiter stores its observation unit it is reset. After output AX First or BX First has been received by control processor 101, signal source 122 generates a second signal transition which resets arbiters 106 and 108.

Arbiter 108 functions identically to arbiter 106, except the signal transitions that reach this arbiter are additionally delayed by delay path segments 102 and 104. Instead of using two delay circuits, one may elect to use only one of delay circuits 124 and 126.

Figure 2A:
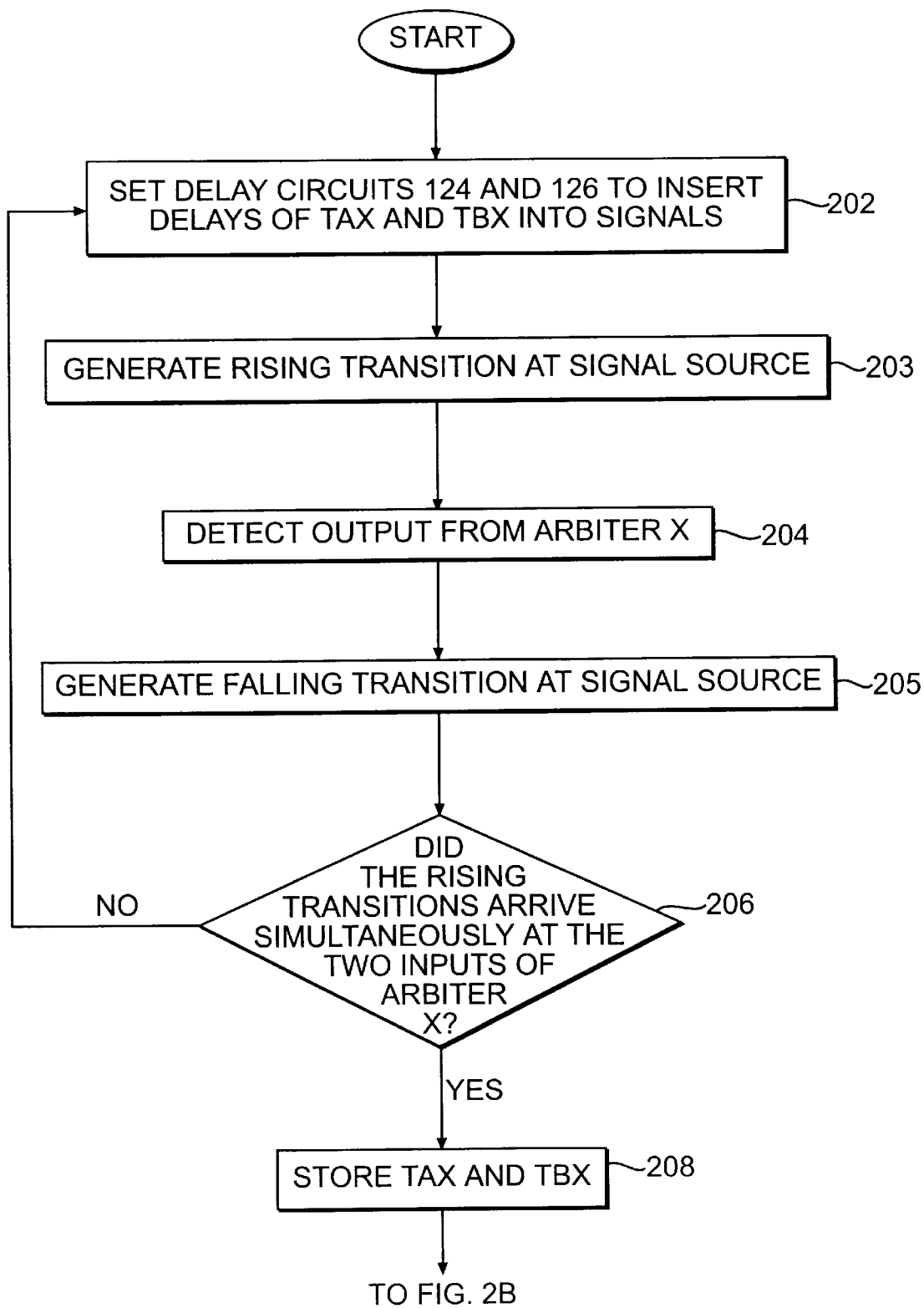
FIGS. 2A and 2B are flowcharts illustrating a procedure for measuring a difference in signal propagation times.
Figure 2B:
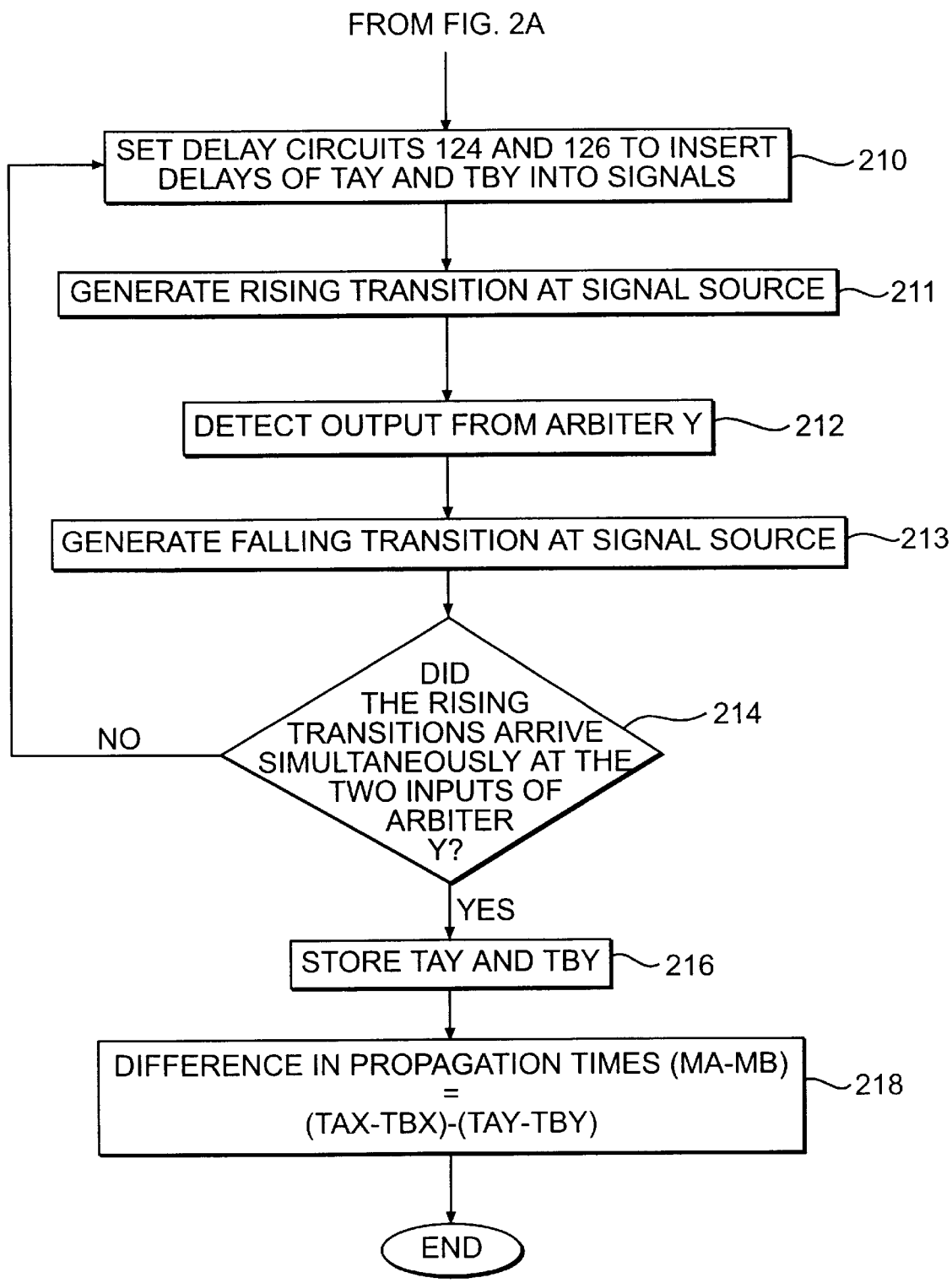

FIGS. 2A and 2B are flowcharts illustrating a process in accordance with the present invention for measuring the difference in signal propagation times between signals traveling through delays 102 and 104.

Central processor 101 adjusts delay circuit 124 to a certain amount of delay, called TAX, and adjusts delay circuit 126 to a second amount of delay, called TBX. Next, control processor 101 controls signal source 122 to generate a rising transition (step 203). Based on the arrival sequence of this transition at AX and BX, arbiter 106 signals whether the transition at AX or the transition at BX arrived first. The arbiter's determination is detected by control processor 101 (step 204), which causes signal source 122 to generate the falling transition to reset the arbiters (step 205). Steps 202 through 205 are repeated until the change in TAX and TBX from the previous iteration of steps 202 through 205 is an incremental change (i.e., an extremely small change relative to the capability of circuits 124, 126) that causes arbiter 106 to change its indication of which signal arrives first (step 206). For example, if the transition arrives first at AX, the control processor 101 may increase the delay in circuit 124 until the transition at BX arrives first. When an incremental change in the delay causes arbiter 106 to change its indication of which signal arrives first, the transitions, delayed by TAX and TBX, arrive at arbiter 106 essentially simultaneously. The propagation delay through the segments 124 and 112 and segment 126 and 110 have been made equal, and control processor 101 stores the delay values TAX and TBX (step 208).

FIG. 2B, at steps 210, 211, 212, 213, and 214, shows the method of FIG. 2A performed based on the output of arbiter 108. Here, the delay values are stored as TAY and TBY, which are the values of delay circuits 124 and 126 at which an incremental change in TAY or TBY causes the arbiter 108 to change its indicator of which signal arrives first (step 216). Finally, the control processor 101 calculates the difference in propagation times between path segments 102 and 104 using the equation (TAX-TBX)−(TAY-TBY) (step 218).

Figure 3A:
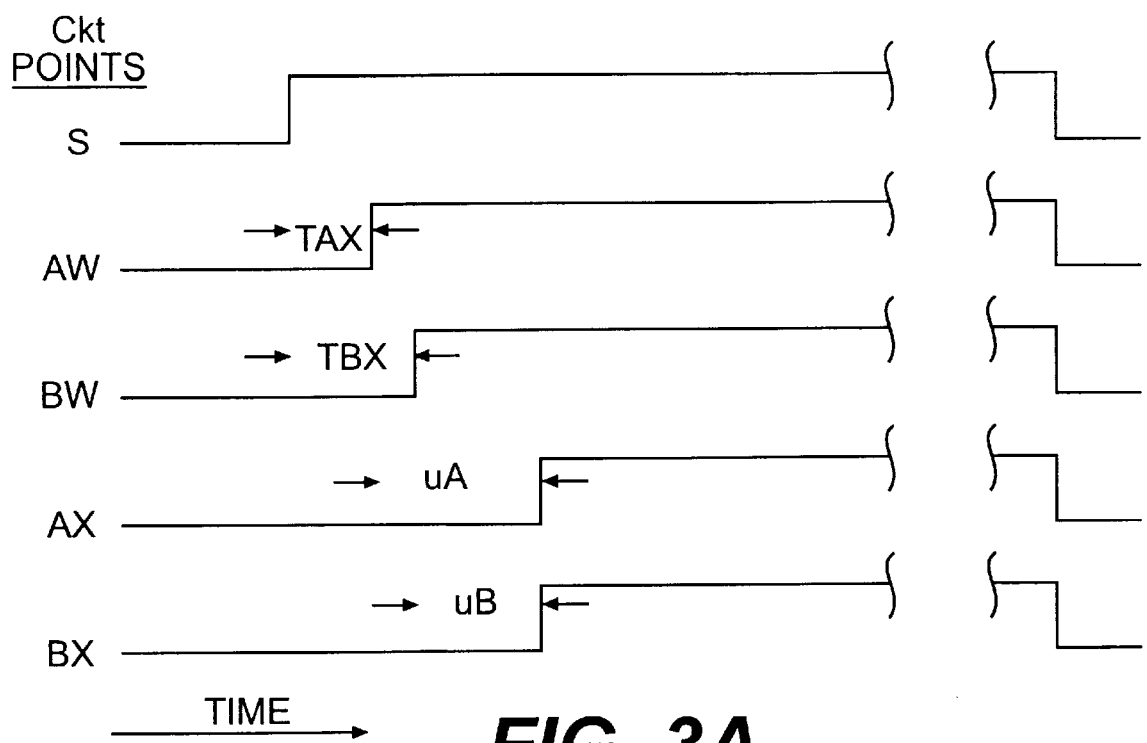
FIGS. 3A and 3B are timing diagrams illustrating exemplary timing relationships of transitions as they propagate through the embodiment shown in FIG. 1.
Figure 3B:
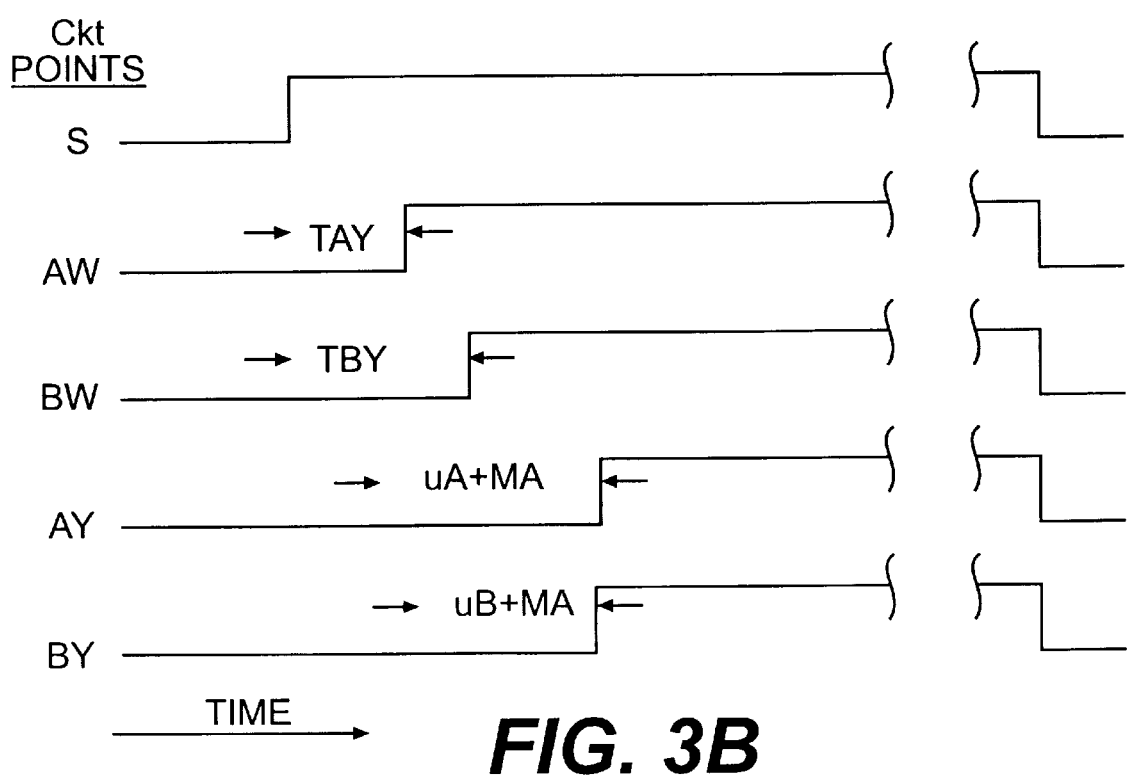

FIGS. 3A and 3B are timing diagrams illustrating exemplary timing relationships of the signals propagated through the circuit shown in FIG. 1. The states of the signals are shown at seven points in FIG. 1, labeled as "S," "AW," "BW," "AX," "BX," "AY," and "BY."

FIG. 3A illustrates an exemplary timing diagram corresponding to the system when step 206 of FIG. 2A is satisfied. As shown, at the points labeled AW and BW in FIG. 1, the signal at point AW has been delayed by TAX, and the signal at point BW has been delayed by TBX. TAX and TBX are adjusted to compensate for the delays 112 and 110 so that both signal transitions arrive at AX and BX simultaneously.

FIG. 3B illustrates an exemplary timing diagram corresponding to the system when step 214 of FIG. 2B is satisfied. As shown, at the points labeled AW and BW in FIG. 1, the signal at point AW has been delayed by TAY, and the signal at point BW has been delayed by TBY. Delay values TAY and TBY are selected such that the signals reach points AY and BY simultaneously.

Although the falling transitions in FIGS. 3A and 3B are shown lined up, this is a limitation in the drawing. They do not necessarily occur at the same time.

Figure 4:
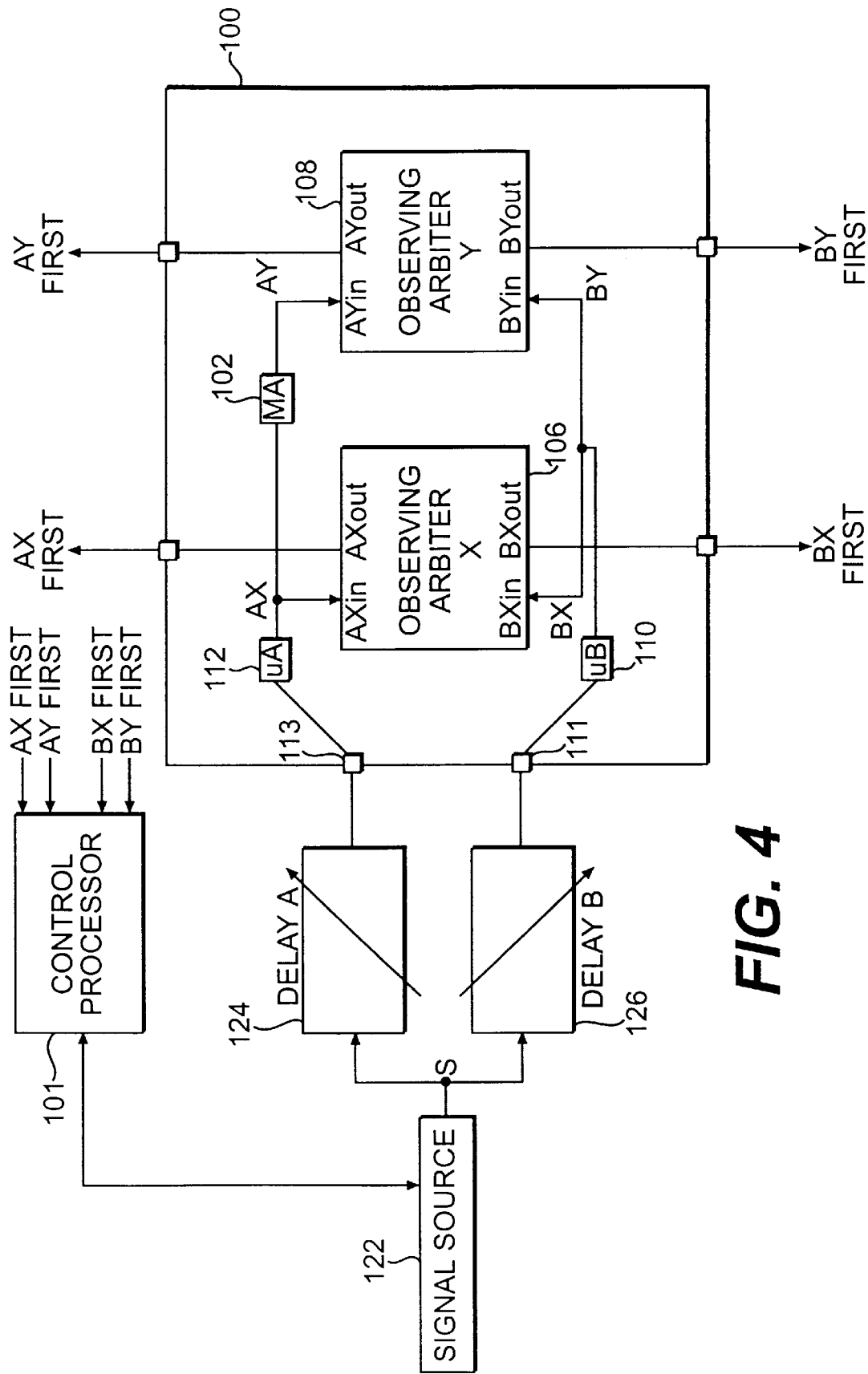
FIG. 4 is a block diagram showing a second embodiment of the present invention.

FIG. 4 shows the present invention configured according to a second embodiment that permits measurement of the absolute propagation delay over delay segment 102. FIG. 4 is similar to FIG. 1, except that arbiters 106 and 108 are arranged such that the propagation time of a signal between the input BXin of arbiter 106 and the input BYin of arbiter 108 is essentially zero. This can be accomplished by positioning the arbiters 106 and 108 so that inputs BXin and BYin are extremely close together, or by ensuring that the paths from delay 110 to input BXin of arbiter 106 and input BYin or arbiter 108 are of equal length.

The embodiment shown in FIG. 4 operates similarly to the embodiment in FIG. 1, except that in steps 210 through 214, TAY is held at the value of TAX so only delay circuit 126 is adjusted. The amount of additional delay that must be added to TBX to obtain TBY is the absolute propagation delay of element 102. Stated in terms of TBX and TBY, the absolute propagation delay equals (TBY-TBX). If delay 102 exceeds the range of delay circuit 126, one may adjust delay circuit 124.

The embodiments of the present invention shown in FIGS. 1–4 rely on the assumption that for particular delay values of circuits 124 and 126, the propagation delays from the signal source 122 to the input of the arbiters are constant and independent of the time relation between the signals traveling along the two paths from S to AX and BX. This is normally a reliable assumption, although one should be wary of unintended coupling of the two paths, which may cause interactions between the signals due to power supply sharing, ground sharing, or by mutual capacitance.

Figure 5:
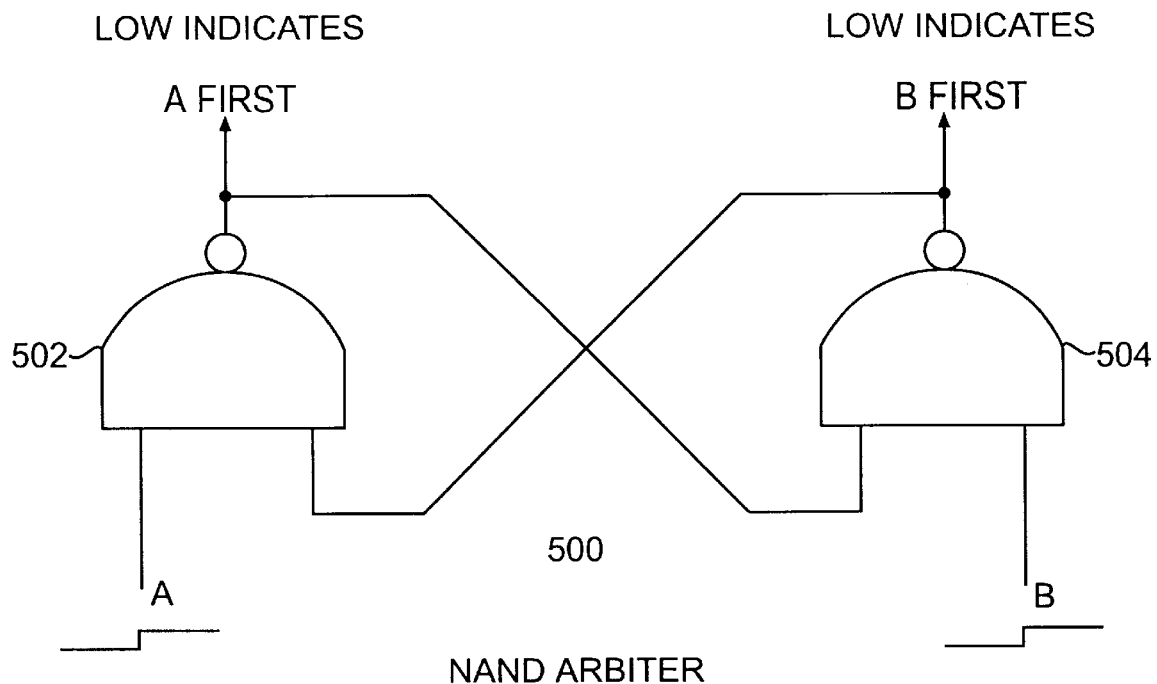
FIG. 5 is a circuit diagram of an arbiter circuit of the type used in FIG. 1 or FIG. 4 for use with signals changing from a low to a high level.

FIG. 5 is a preferred circuit diagram of an arbiter circuit 500 of the type used in the present invention for use with signal transitions changing from a low (zero) to high (one) level. In this embodiment, NAND gate 502 and NAND gate 504 are cross-coupled as a latch so that NAND gate 502 receives external input signals at one input and the output of NAND gate 504 at its second input. NAND gate 504 receives external input signals at its second input and the output of NAND gate 502 at its first input.

When both NAND gate external inputs are at a logic zero, the output of NAND gate 502 and NAND gate 504 are at a logic one. The first NAND gate to receive a rising transition at its input will change its output to a logic zero. A low output on either NAND gate indicates that the input signal transition corresponding to that NAND gate arrived before the input signal transition corresponding to the other NAND gate. As long as the first NAND gate remains at a logic zero output, the NAND gate corresponding to the later received input signal remains at a logic one output even after its input signal arrives. To reset the arbiter, both external inputs are set to logic zero.

Figure 6:
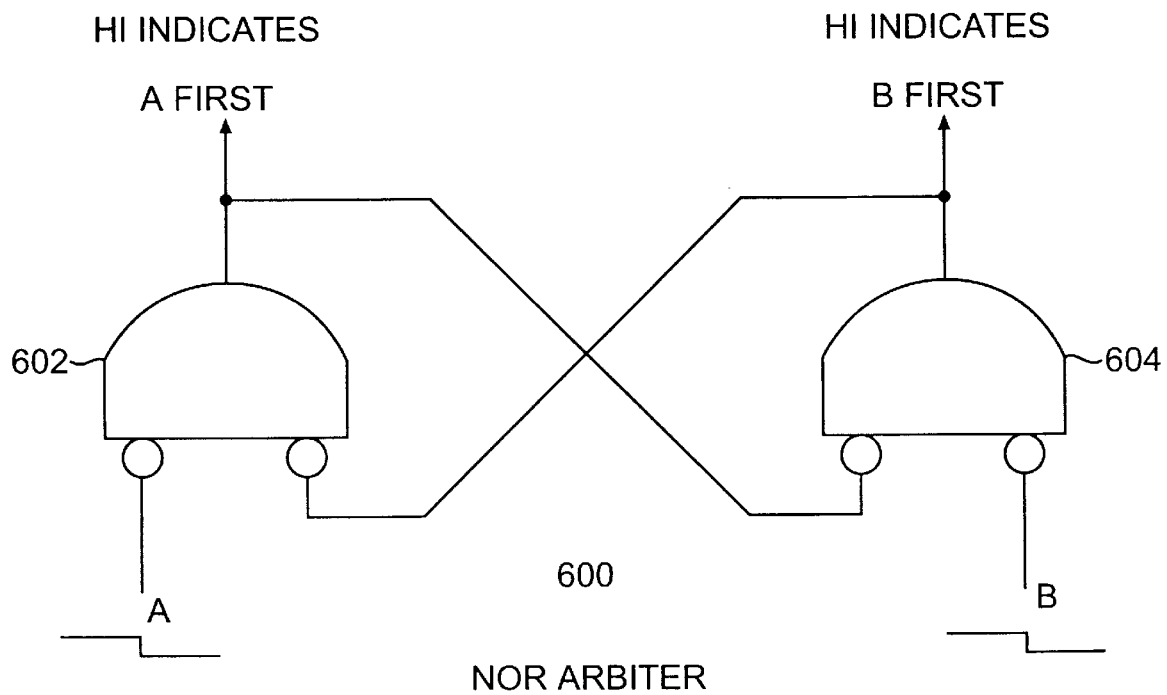
FIG. 6 is a circuit diagram of an arbiter circuit of the type used in FIG. 1 or FIG. 4 for use with signals changing from a high to a low level.

FIG. 6 is a circuit diagram of an arbiter circuit 600 of the type used in the present invention for use with signals that change from a high to a low level. In this embodiment, NOR gate 602 and NOR gate 604 are cross coupled so that NOR gate 602 receives external input signals at its first input and the output of NOR gate 604 at its second input. NOR gate 604 receives external input signals at its B input and the output of NOR gate 602 at its other input. Arbiter circuit 600 operates similarly to arbiter circuit 500, although as previously mentioned, the signal transitions are of the opposite direction.

Arbiters 500 and 600 are small enough to allow placement of many on a chip without significantly affecting chip area. Additionally, because of their simplicity and symmetry, the arbiters can discriminate between extremely small differences in signal arrival time.

All real circuit implementations, however, have slight differences in NAND or NOR gates, and one of the gates will be slower to respond than the other. This will introduce a bias in the arbiter, e.g., such that it reports "A first" when in fact the B input signal may have arrived slightly before the A input signal.

Figure 7A:
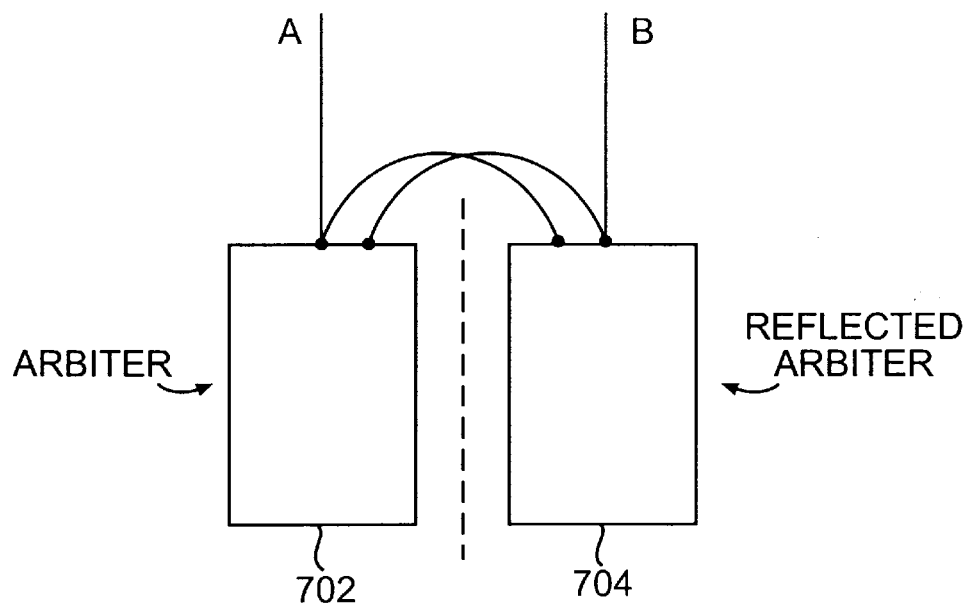
FIGS. 7A–7D are diagrams illustrating an arbiter bias testing circuit according to the present invention.

FIG. 7A is high level diagram of a circuit configured to test for bias in the arbiters of FIGS. 5 and 6. Two arbiters, 702 and 704, which are laid out on the chip to be physically long and narrow, are constructed as mirror images of one another. This ensures that corresponding circuit elements of arbiter 702 and "reflected" arbiter 704 are as close to one another as possible, and are thus as similar as possible.

Figure 7B:
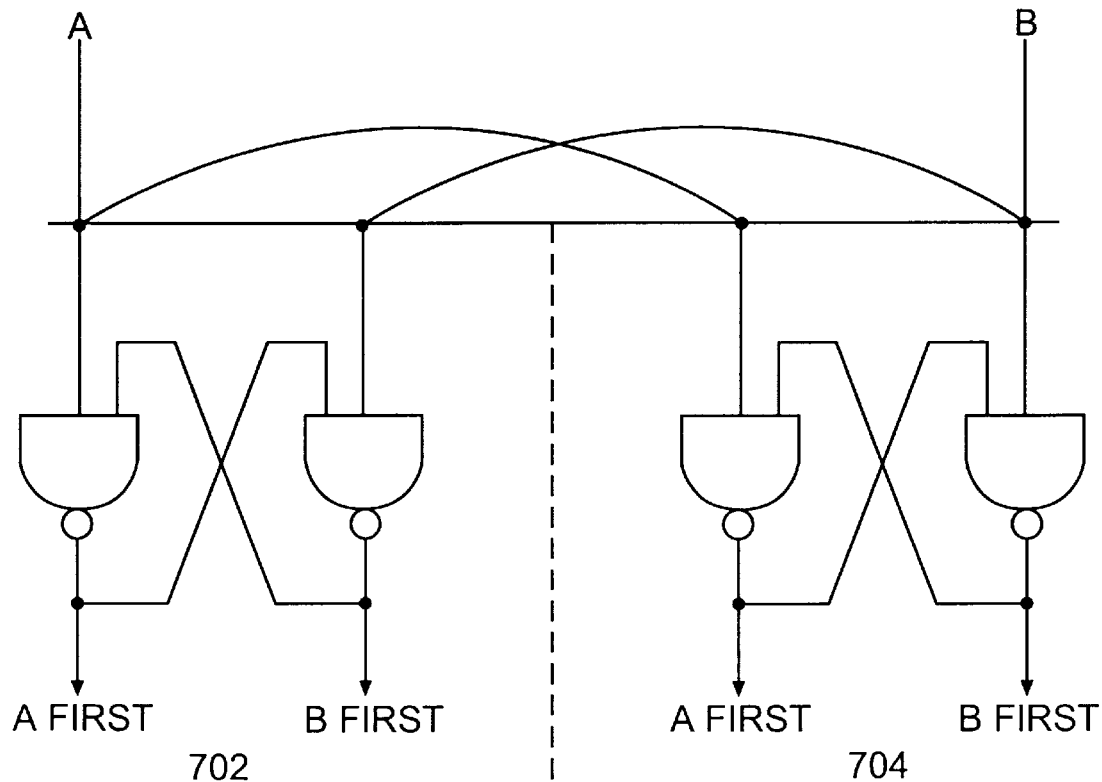

FIG. 7B is a circuit diagram showing the elements of FIG. 7A in greater detail. Arbiters 702 and 704 are each shown as the NAND gate arbiter described in FIG. 5, although the NOR gate arbiter of FIG. 6 may be substituted for the arbiters 702 and 704.

If there is no bias in arbiters 702, 704, then, for given propagation delays on signal lines A and B, the arbiters 702 and 704 should both correctly indicate whether the transition on line A or line B occurred first. If there is bias in the arbiters, the two arbiters may differ as to which signal transition arrived first.

Figure 7C:
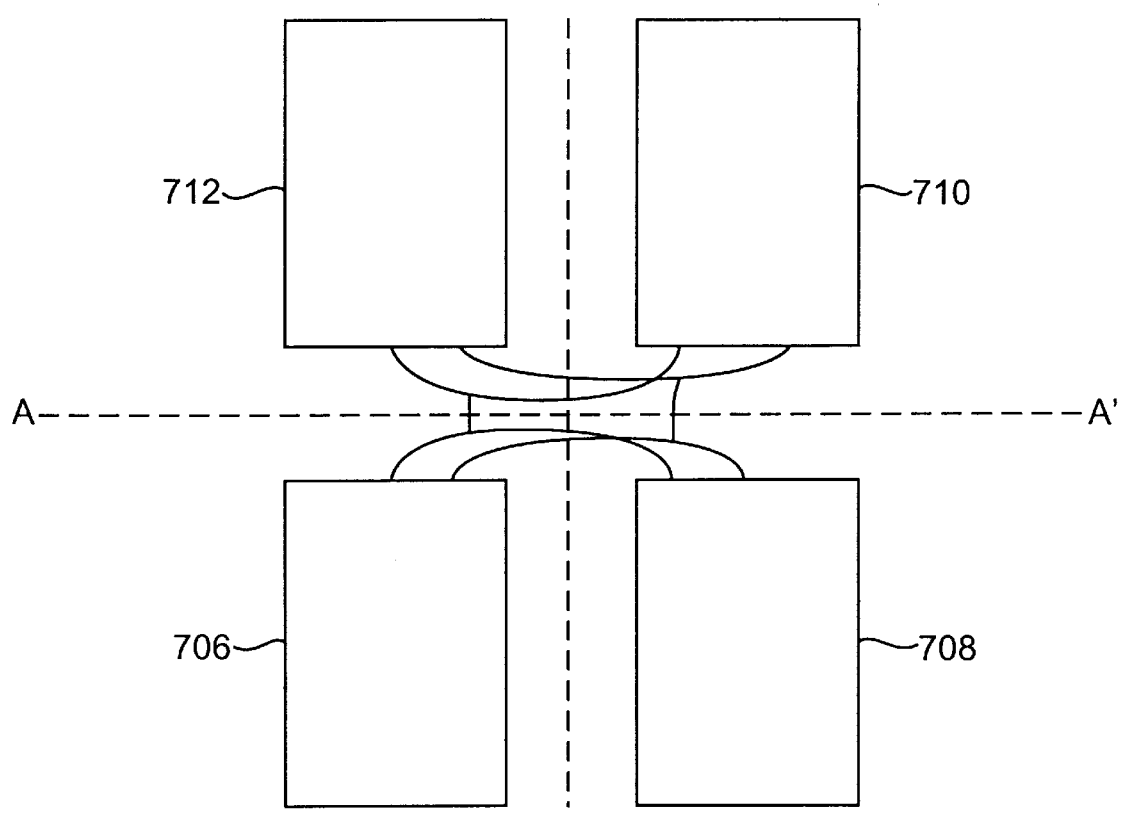
Figure 7D:
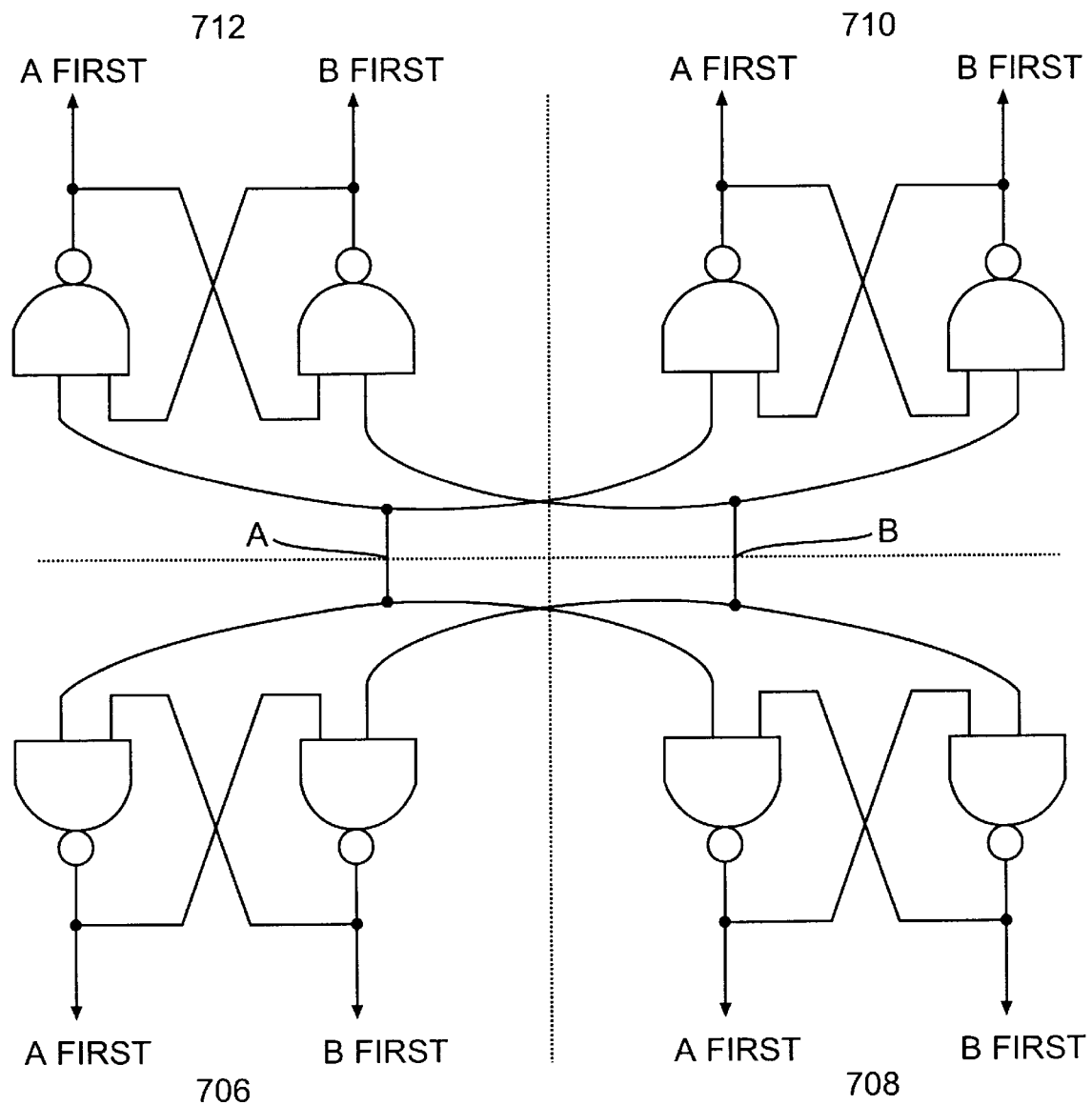

FIG. 7C is a high level diagram showing an alternate embodiment of the bias testing circuit of FIGS. 7A and 7B. FIG. 7D is a circuit diagram showing the elements of FIG. 7C in greater detail. This embodiment is similar to that shown in FIGS. 7A and 7B, with the addition of two more arbiters "reflected" around a perpendicular axis of reflection A—A'. Each of the four arbiters 706, 708, 710, and 712 are constructed according to the NAND arbiter 500 or the NOR arbiter 600. Compared to the embodiment of FIG. 7B, the bias testing circuit of FIG. 7C allows for an increased number of cross-comparisons and consistency checks.

The arbiter circuits described in this disclosure precisely determine which of two input signals arrive first. Once such a determination has been made, the result may be transmitted off the semiconductor chip at a later time. Multiplexers or other steering circuits can also minimize the number of circuit pins that need to be devoted to delay measurements.

The technique described in this disclosure can measure delay values and differences on the order of picoseconds without requiring any special techniques for inserting signals on-chip or bringing signals from a chip-out for external measurement. This measurement method is useful for the study of synchronous as well as asynchronous circuits, for example, for measuring the propagation along clock distribution nets.

It will be apparent to those skilled in the art that various modifications and variations can be made to the present invention without departing from the scope or spirit of the invention.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A system to output the difference in propagation delay of a first signal path segment and a second signal path segment in an integrated circuit, the device comprising:
   a signal source configured to generate a transition and to transmit the generated transition;
   a delay circuit configured to receive the transition, and, based on the transition, to transmit a first transition to the first signal path segment with a selectable delay and a second transition to the second signal path segment with a selectable delay;
   the integrated circuit further including:
      a first arbiter circuit coupled at its inputs to one end of the first and to one end of the second signal path segments, the first arbiter circuit including mechanisms configured to determine on which of the first and second signal path segments leading edge transitions of the first and second transitions arrive first; and
      a second arbiter circuit coupled at its inputs to a second end of the first and second signal path segments, the second arbiter circuit including mechanisms configured to determine on which of the first and second signal path segments leading edge transitions of the first and second transitions arrive first.

2. The system of claim 1 wherein the first and second arbiter circuits each include first and second outputs, and mechanisms for placing a signal on the first output if the leading edge transition of the first transition arrives before the leading edge transition of the second transition, and for placing a signal on the second output if the leading edge transition of the second transition arrives before the leading edge transition of the first transition.

3. The system of claim 1 wherein the first and second arbiter circuits each comprise:
   a first NAND gate having first and second inputs and an output, the first input of the first NAND gate receiving the first signal path; and
   a second NAND gate having first and second inputs and an output, the first input of the second NAND gate receiving the second signal path, the second input of the second NAND gate receiving the output of the first NAND gate, and the output of the second NAND gate connecting to the second input of the first NAND gate.

4. The system of claim 1, wherein the first and second arbiter circuits each comprise:
   a first NOR gate having first and second inputs and an output, the first input of the first NOR gate receiving the first signal path; and
   a second NOR gate having first and second inputs and an output, the first input of the second NOR gate receiving the second signal path, the second input of the second NOR gate receiving the output of the first NOR gate, and the output of the second NOR gate connecting to the second input of the first NOR gate.

5. The system of claim 1, the delay circuit further comprising:
   a first delay circuit configured to receive the generated transition and delay the generated transition for a first predetermined time interval; and
   a second delay circuit configured to receive the generated transition and delay the generated transition for a second predetermined time interval.

6. A system for measuring propagation delay between a pair of signal path segments on an integrated circuit, the device comprising:
   arbiter circuitry having at least two inputs coupled to each of the pair of signal path segments, the at least two inputs for each of the pair of signal path segments being at spaced locations, and the arbiter circuitry having an output corresponding to each said input;
   adjustable delay circuitry having an output leading to at least one of the pair of signal path segments at one of the spaced locations; and
   a control processor coupled to the adjustable delay circuitry and having inputs coupled to the corresponding number of outputs of the arbiter circuitry, the control processor being configured to output the difference in propagation time of signals transmitted on the pair of signal path segments between the spaced locations.

7. The system of claim 6, wherein the arbiter circuitry includes first and second arbiter circuits each comprising:
   a first NAND gate having first and second inputs and an output, the first input of the first NAND gate receiving the first signal path; and
   a second NAND gate having first and second inputs and an output, the first input of the second NAND gate receiving the second signal path, the second input of the second NAND gate receiving the output of the first NAND gate, and the output of the second NAND gate connecting to the second input of the first NAND gate.

8. The system of claim 6, wherein the arbiter circuitry includes first and second arbiter circuits each comprising:
   a first NOR gate having first and second inputs and an output, the first input of the first NOR gate receiving the first signal path; and
   a second NOR gate having first and second inputs and an output, the first input of the second NOR gate receiving the second signal path, the second input of the second NOR gate receiving the output of the first NOR gate, and the output of the second NOR gate connecting to the second input of the first NOR gate.

9. The system of claim 6, the delay circuitry further comprising:
   a first delay circuit configured to receive a first test transition and delay the first test transition for a first predetermined time interval; and a second delay circuit configured to receive a second test transition and delay the second test transition for a second predetermined time interval.

10. A method of measuring propagation delay between a first signal path segment and a second signal path segment, the method comprising:

detecting an arrival of a first signal transition at a beginning of the first signal path segment and detecting an arrival of a second signal transition at a beginning of the second signal path segment;

adjusting a delay until the first and second signal transitions arrive simultaneously at the beginning of the first and second signal path segments;

measuring a first delay parameter value of the first and second signal transitions;

detecting an arrival of a third signal transition at an end of the first signal path segment;

detecting an arrival of a fourth signal transition at an end of the second signal path segment;

adjusting a delay until the third and fourth signal transitions arrive simultaneously at the end of the first and second signal path segments;

measuring a second delay parameter value of the third and fourth transitions; and outputting the difference in the propagation delay between the first signal path segment and the second signal path segment based on the first and second delay parameter values.

11. The method of claim 10, wherein the measuring step include the substeps of measuring the first and second delay parameters as a difference between the adjusted delays in the first and second transitions.

12. The method of claim 11, wherein the calculating step includes the substep of subtracting the first delay parameter from the second delay parameter.

13. The method of claim 10, wherein the steps of adjusting a delay until the first and second signal transitions arrive nearly simultaneously include the substep of altering the delay in one or both of the first and second signal transitions until an incremental delay alteration changes a signal transition order of arrival at the beginning of the first and second signal path segments.

* * * * *